United States Patent
Bu et al.

(10) Patent No.: US 10,361,261 B2
(45) Date of Patent: Jul. 23, 2019

(54) MANUFACTURING METHOD OF TFT SUBSTRATE, TFT SUBSTRATE, AND OLED DISPLAY PANEL

(71) Applicant: Wuhan China Star Optoelectronics Semiconductor Display Technology Co., Ltd., Wuhan, Hubei (CN)

(72) Inventors: Chenghao Bu, Guangdong (CN); Hong Fang, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/737,300

(22) PCT Filed: Oct. 20, 2017

(86) PCT No.: PCT/CN2017/106969
§ 371 (c)(1),
(2) Date: Dec. 17, 2017

(87) PCT Pub. No.: WO2019/029007
PCT Pub. Date: Feb. 14, 2019

(65) Prior Publication Data
US 2019/0051713 A1 Feb. 14, 2019

(30) Foreign Application Priority Data
Aug. 9, 2017 (CN) .......................... 2017 1 0675438

(51) Int. Cl.
*H01L 29/08* (2006.01)
*H01L 27/32* (2006.01)
(Continued)

(52) U.S. Cl.
CPC .... *H01L 27/3262* (2013.01); *H01L 21/02532* (2013.01); *H01L 21/02592* (2013.01); *H01L 21/02675* (2013.01); *H01L 21/26513* (2013.01); *H01L 21/32139* (2013.01); *H01L 27/1262* (2013.01); *H01L 27/1274* (2013.01); *H01L 27/1288* (2013.01); *H01L 27/3248* (2013.01); *H01L 27/3258* (2013.01);
(Continued)

(58) Field of Classification Search
CPC .................................................. H01L 27/3264
USPC .......................................................... 257/40
See application file for complete search history.

(56) References Cited

U.S. PATENT DOCUMENTS

2004/0086807 A1* 5/2004 Peng ................ H01L 29/66765
430/317

* cited by examiner

*Primary Examiner* — Ajay Arora
(74) *Attorney, Agent, or Firm* — Andrew C. Cheng

(57) ABSTRACT

This disclosure discloses a manufacturing method of a TFT substrate, a TFT substrate, and an OLED display panel. The manufacturing method of the TFT substrate includes sequentially forming a gate electrode, a gate insulating layer, a polysilicon layer, and a barrier layer on the substrate, the polysilicon layer including a source region, a drain region, and a channel region; the barrier layer above the source and drain regions is etched by a photomask so that the thickness of the barrier layer allows ions to pass through and is not zero; and then the polysilicon layer is ion implanted; through the method, the polysilicon layer of the source and drain regions can be ion implanted without exposing the polysilicon layer, the damage of the polysilicon layer during the process can be avoided, and the stability of the TFT substrate can be improved, thereby improving the display quality.

8 Claims, 3 Drawing Sheets

(51) Int. Cl.
*H01L 21/02* (2006.01)
*H01L 21/265* (2006.01)
*H01L 21/3213* (2006.01)
*H01L 27/12* (2006.01)
*H01L 29/66* (2006.01)
*H01L 29/786* (2006.01)
*H01L 51/00* (2006.01)

(52) U.S. Cl.
CPC .... *H01L 27/3276* (2013.01); *H01L 29/66765* (2013.01); *H01L 29/78678* (2013.01); *H01L 27/124* (2013.01); *H01L 27/1218* (2013.01); *H01L 27/1248* (2013.01); *H01L 51/0097* (2013.01); *H01L 2227/323* (2013.01); *H01L 2251/5338* (2013.01)

MANUFACTURING METHOD OF TFT SUBSTRATE, TFT SUBSTRATE, AND OLED DISPLAY PANEL

FIELD OF THE DISCLOSURE

This disclosure relates to a display technology, and more particularly to a manufacturing method of a TFT substrate, a TFT substrate, and an OLED display panel.

BACKGROUND

With the development of display technology, the requirements for people on the display panel resolution are getting higher and higher. In the prior art, in order to improve the resolution of the display panel, the low-temperature polysilicon technology is often employed in the display panel, i.e., low-temperature polysilicon TFT display substrate, but the TFT substrate currently used is generally a top-gate TFT substrate, i.e. a gate of the TFT is fabricated at the top of the TFT structure; the top-gate TFT substrate has excellent electrical properties, but its reliability is low.

When the top-gate TFT substrate undergoes excimer laser annealing of the amorphous silicon during the manufacturing process, unavoidable protrusions are formed on the formed polysilicon layer, and the protrusions affect the interface quality between the gate insulating layer and the polysilicon layer, the breakdown voltage of the gate insulating layer is reduced, thereby the further reduction in the thickness of the gate insulating layer is limited.

In the prior art, a bottom-gate TFT substrate is also used in some display panels. However, in the prior art, when a bottom-gate TFT substrate is fabricated, it is necessary to etch the barrier layer on the polysilicon layer to expose the polysilicon layer of the source and drain electrodes, and then to perform an ion implantation to the polysilicon layer of the source and drain electrodes; through this method, the damage of polysilicon below the barrier layer will be caused and the defect thereof will be introduced when the barrier layer is etched, the polysilicon layer will be completely etched when it gets serious, thereby the display quality of the display panel is affected.

SUMMARY

In view of this, this disclosure provides a manufacturing method of a TFT substrate, a TFT substrate, and an OLED display panel, and the manufacturing method of the TFT substrate solves the problem of reduction of the display quality due to the influence of the etching of the polysilicon layer.

To solve the problems, one technical proposal of this disclosure is to provide an OLED display panel including:

a TFT substrate, and a planarization layer, an anode layer, and an organic light emitting device layer formed on the TFT substrate; and the anode layer providing anode driving signals for the organic light emitting device layer, and the anode layer being connected to the drain electrode of the TFT substrate;

wherein the TFT substrate includes a substrate, and a gate electrode, a gate insulating layer, a polysilicon layer, a barrier layer, a source electrode, and a drain electrode formed on the substrate, wherein the polysilicon layer includes a source region, a drain region, and the channel region, and the polysilicon layer of the source and drain regions is ion implanted;

the source and drain electrodes pass through the barrier layer on the source and drain regions respectively and are connected to the polysilicon layer of the source and drain regions through the first contact holes on the ion-implanted polysilicon layer;

wherein the thickness of the barrier layer on the source and drain regions is a thickness that ions can pass through and is not zero;

the TFT substrate further includes a second contact hole, a metal wire in the same layer as the gate electrode, and a metal wire in the same layer as the source and drain electrodes, and the metal wire in the same layer as the gate electrode is located below the barrier layer disposed outside the polysilicon layer;

wherein the second contact hole is disposed on the barrier layer outside the polysilicon layer, the metal wire in the same layer as the gate electrode passes through the second contact hole and is connected with the metal wire in the same layer as the source and drain electrodes.

Another technical proposal of this disclosure is to provide a TFT substrate, including:

a substrate and a gate electrode, a gate insulating layer, a polysilicon layer, a barrier layer, a source electrode, and a drain electrode formed on the substrate, wherein the polysilicon layer includes a source region, a drain region, and a channel region, the polysilicon layer of the source and drain regions is ion implanted;

the source and drain electrodes pass through the barrier layer on the source and drain regions respectively and are connected to the polysilicon layer of the source and drain regions through the first contact hole on the ion-implanted polysilicon layer;

wherein the thickness of the barrier layer on the source and drain regions is a thickness that ions can pass through and is not zero;

A further technical proposal of this disclosure is to provide a manufacturing method of the TFT substrate, including:

sequentially forming a gate electrode, a gate insulating layer, a polysilicon layer, and a barrier layer on a substrate, wherein the polysilicon layer includes a source region, a drain region, and a channel region;

etching the barrier layer located on the source and drain regions through a first photomask so that the thickness of the barrier layer on the source and drain regions is the thickness that ion can pass through and is not zero;

performing an ion implantation to the polysilicon layer of the source and drain regions;

patterning the barrier layer on the source and drain regions through a second photomask to form first contact holes on the barrier layer on the source and drain regions respectively;

forming a source electrode and a drain electrode on the barrier layer, wherein the source and drain electrodes are connected to the polysilicon layer of the source and drain regions by passing through the first contact holes.

The beneficial effect is that different from the prior art, a flexible display panel of an embodiment of this disclosure includes a flexible substrate and a functional layer, the flexible substrate includes at least two non-bending regions and a bending region located between at least two non-bending regions, and at least one of the at least two non-bending regions is used as a display area; the display area and the bending region of the flexible substrate are provided with an organic light emitting device layer, wherein the display area of the flexible substrate is further provided with at least one metal layer for providing the signal to the organic light emitting device layer, and the bending region thereof is provided with a buffer layer. According to this disclosure, the driving portion for driving the organic light emitting device layer in the bending region is disposed in the non-bending region in the vicinity of the bending region while the organic device light emitting layer is disposed in the bending region of the flexible display panel; while the picture can also be displayed in the bending region, the probability of damage to the metal wires in the bending region due to the effect of bending can be reduced and the service life of the display panel can be improved.

DETAILED DESCRIPTION OF PREFERRED EMBODIMENTS

Figure 1:
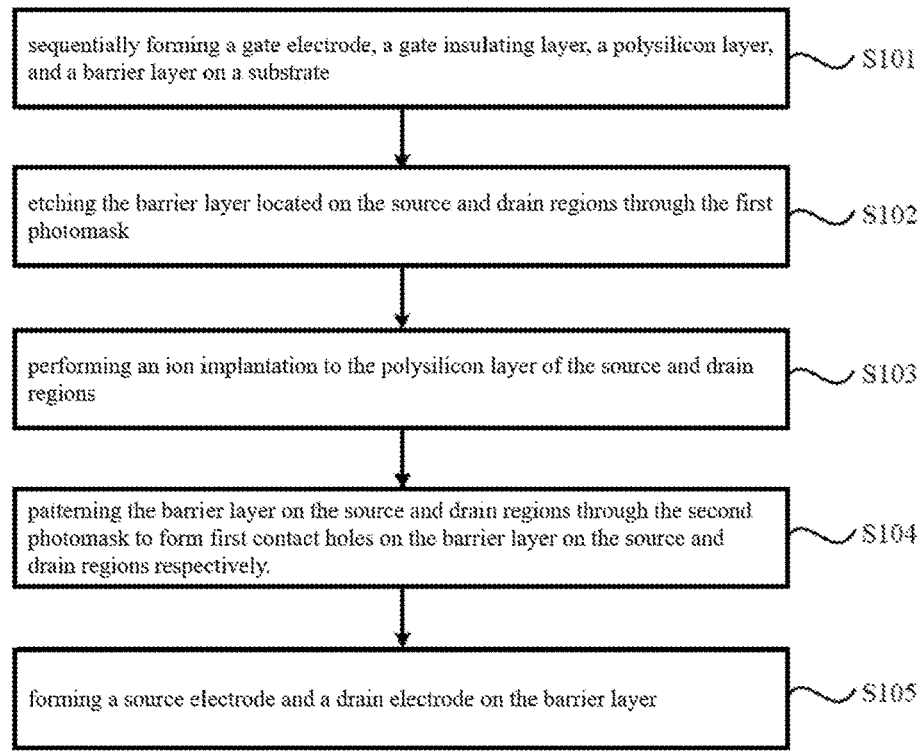
FIG. 1 is a schematic flow chart of an embodiment of a manufacturing method of a TFT substrate according to this disclosure.

The technical proposals in the embodiments of this disclosure will be described in detail below in connection with the accompanying drawings in the embodiments of this disclosure. In the specification and drawings, the same reference numerals are used for the same structures. Obviously, the embodiments described herein are only a part of, but not all of the embodiments of this disclosure. In view of the embodiments described herein, any other embodiment obtained by those of ordinary skill in the art skilled in this art without offering creative effort is included in a scope claimed by this disclosure.

Referring to FIG. 1, FIG. 1 is a schematic flow chart of an embodiment of a manufacturing method of a TFT substrate according to this disclosure. As shown in FIG. 1, the manufacturing method of the embodiment may include the steps of:

S101: sequentially forming a gate electrode, a gate insulating layer, a polysilicon layer, and a barrier layer on a substrate.

In this embodiment, the substrate 10 may be made of PEN (Polyethylene naphthalene), PET (Polyethylene terephthalate) or PI (Polyimide) or glass.

In addition, the substrate 10 may also be a flexible substrate, that is, the TFT substrate of this embodiment is applied to a flexible display device. In a bottom-gate TFT substrate, since the gate insulating layer and the polysilicon layer are fabricated together in the vacuum apparatus, it is not necessary to expose the polysilicon layer first and then to dispose the gate insulating layer. Therefore, the application of the bottom-gate TFT substrate in the flexible display panel can improve the display quality of the flexible display panel. Further, since the polysilicon layer in the bottom-gate TFT substrate is fabricated on the gate insulating layer, the protrusions formed on the surface of the polysilicon layer do not affect the interface quality between the polysilicon layer and the gate insulating layer when forming the polysilicon layer, so that when the flexible display panel is bent, it is not easy to cause cracks due to the protrusions on the surface of the polysilicon layer, and the stability of the flexible display panel can be improved.

Figure 2A:
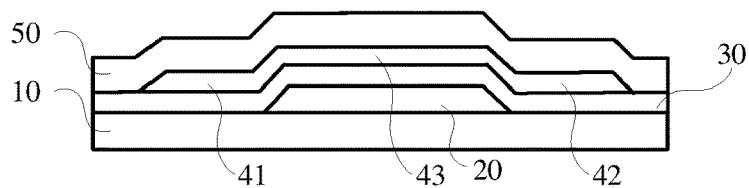
FIGS. 2a to 2e are schematic cross-sectional views of an application example of the TFT substrate in each step shown in FIG. 1.

As shown in FIG. 2a, a gate electrode 20, a gate insulating layer 30, a polysilicon layer, and a barrier layer 50 are sequentially formed on the substrate 10 by sputtering, chemical vapor deposition or the like. It is to be understood that the polysilicon layer is fabricated by first depositing an amorphous silicon layer and then converting the amorphous silicon layer into a polysilicon layer by excimer laser annealing or the like to obtain a polysilicon layer and then depositing a barrier layer 50 on the polysilicon layer; it is noted that before depositing the barrier layer 50 on the polysilicon layer, exposing and etching the polysilicon layer is needed, that is, patterning the polysilicon layer, and then depositing the barrier layer 50 on the patterned polysilicon layer. The patterned polysilicon layer is divided into a source region 41, a drain region 42, and a channel region 43, and the source region 41 and the drain region 42 are located on both sides of the channel region 43 respectively.

It can be understood that before forming the gate electrode 20 on the substrate 10, a buffer layer was also fabricated (not shown) on the substrate 10, the buffer layer is a buffer layer of silicon nitride and a buffer layer of silicon oxide; the gate electrode 20, the gate insulating layer 30, the polysilicon layer, and the barrier layer 50 formed on the substrate 10 are all formed on the buffer layer.

S102: etching the barrier layer located on the source and drain regions through the first photomask so that the thickness of the barrier layer on the source and drain regions is a thickness that ions can pass through and is not zero;

etching the barrier layer 50 by a photomask, specifically, etching the barrier layer 50 on the source region 41 and drain region 42 to reduce the thickness of the barrier layer 50 on the source region 41 and drain region 42, so as to reduce the thickness of the barrier layer 50 on the source region 41 and drain region 42 to the thickness that allows ions to pass through, but not to be zero, i.e., the polysilicon layer of the source region 41 and the drain region 42 is not exposed.

Figure 2B:
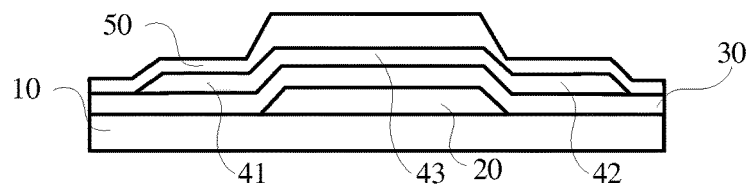

In the embodiment, since the barrier layer 50 on the channel region 43 is protected by the photoresist, the barrier layer 50 on the channel region 43 is not etched, but the barrier layer 50 on the source region 41 and the drain region 42 is not protected by the photoresist and will be etched; as shown in FIG. 2b, after being etched through the first photomask, the thickness of the barrier layer 50 on the channel region 43 is greater than the thickness of the barrier layer 50 on the source region 41 and the drain region 42. It is noted that the thickness of the barrier layer 43 on the channel region 50 after being etched is required to be the thickness that ions is not allowed to pass through. Alternatively, the transmittance of the portion in the first photomask corresponding to the barrier layer 50 on the channel region 43 is set to zero, then the barrier layer 50 on the channel region 43 is not etched, but the barrier layer 50 on the drain region 41 and the drain region 42 is etched, that is, the thickness of the barrier layer 50 on the channel region 43 after being etched through the first photomask is the same as that before etching.

In order to be able to achieve the ion implantation of the polysilicon layer of the source region 41 and the drain region 42, the barrier layer 50 has a thickness of 2800 to 3200 Å before etching, and in the embodiment, the barrier layer 50 has a thickness of 3000 Å before etching; the barrier layer 50 on the source region 41 and the drain region 42 is etched to 450 to 550 Å through the first photomask, and in the embodiment, the thickness of the barrier layer 50 on the source region 41 and the drain region 42 after etching is 500 Å.

S103: performing an ion implantation to the polysilicon layer of the source and drain regions.

In this case, performing an ion implantation to the TFT substrate fabricated by step S102, since the thickness of the barrier layer 50 on the polysilicon layer of the channel region 43 is large, ions are not allowed to pass through the barrier layer 50 on the channel region 43, but the thickness of the barrier layer 50 on the region 41 and the drain region 42 can allows ions to pass through, therefore ions can be implanted into the polysilicon layer of the source region 41 and the drain region 42 through the barrier layer 50 on the source region 41 and the drain region 42.

Figure 2C:
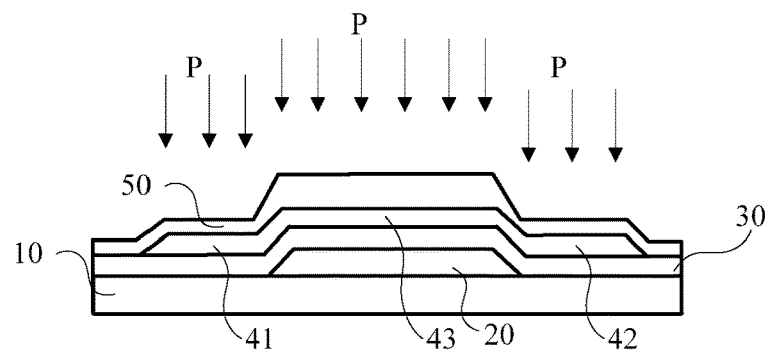

As shown in FIG. 2c, when the polysilicon layer of the source region 41 and the drain region 42 is ion implanted in this embodiment, the entire TFT substrate fabricated by the step S102 is ion implanted; in this embodiment, Boron atoms are used for ion implantation, and in other embodiments, other ions may be used for ion implantation, and this disclosure is not particularly limited. Since the thickness of the barrier layer 50t on the source region 41 and drain region 42 is smaller and the thickness of the barrier layer 43 on the channel region 43 is larger, by using the thickness difference in the barrier layer on the source region 41, the drain region 42, and the channel region 43, the boron ions implanted above the source region 41 and the drain region 42 can be implanted into the polysilicon layer through the barrier layer 50, and the boron ions above the channel region 43 are blocked by the barrier layer 50, and then the ion implantation to the polysilicon layer of the source region 41 and the drain region 42 can be achieved. In this embodiment, the polysilicon layer of the source region 41 and the drain region 42 can be ion implanted without exposing the polysilicon layer by etching, thereby the damage of the polysilicon layer during the etching process can be avoided, and then the display quality is not affected.

S104: patterning the barrier layer on the source and drain regions through a second photomask to form first contact holes on the barrier layer on the source and drain regions respectively.

Figure 2D:
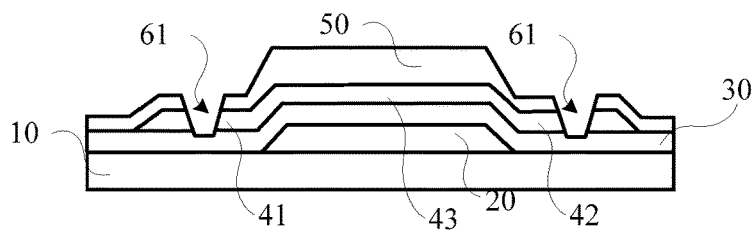

In order to enable the source electrode 71 and the drain electrode 72 fabricated in the subsequent step to be connected respectively to the polysilicon layer of the source region 41 and the drain region 42, the barrier layer 50 on the source region 41 and the drain region 42 is patterned through another photomask to form the first contact holes 61. As shown in FIG. 2d, when the barrier layer 50 on the source region 41 and the drain region 42 is etched by using the second photomask, the ion implanted polysilicon layer is also etched; the first contact holes 61 pass through the ion implanted polysilicon layer, and the bottom of the first contact holes 61 expose the gate insulating layer 30. The depth of the first contact holes 61 is greater than or equal to the sum of the thickness of the barrier layer 50 on the source region 41 and the drain region 42 after etching and the thickness of the polysilicon layer of the source region 41 and the drain region 42.

S105: forming a source electrode and a drain electrode on the barrier layer.

Figure 2E:
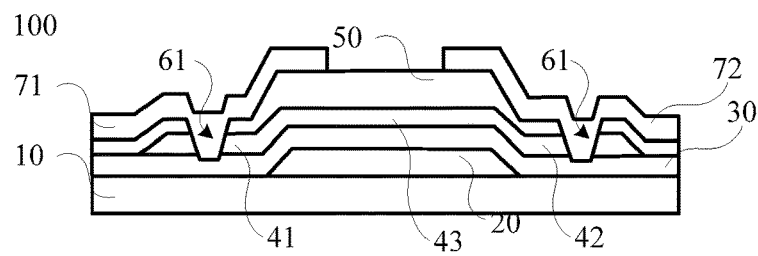

As shown in FIG. 2e, a metal layer is deposited on the substrate 10 by sputtering or the like, and the metal layer is patterned by another photomask to form the source electrode 71 and the drain electrode 72; The material of the metal layer includes but not limited to gold, silver, copper or iron and other materials. The source electrode 71 and the drain electrode 72 formed in this step are located one the barrier layer 50 and the first contact holes 61 fabricated by step S104 are connected respectively to the polysilicon layers of the source region 41 and the drain region 42. The TFT substrate 100 shown in FIG. 2E is the TFT substrate obtained by the manufacturing method.

In this embodiment, since the first contact holes 61 pass through the ion implanted polysilicon layer and the bottom of the first contact holes 61 expose the gate insulating layer 30, the fabricated source electrode 71 and the drain electrode 72 are contacted with the polysilicon layer by the side. It can be understood that the side surfaces of the first contact holes 61 are relatively smooth when the polysilicon layer is etched during the fabrication of the first contact holes 61, therefore the contact surfaces that the source electrode 71 and the drain electrode 72 contact respectively with the polysilicon layer of the source region 41 and the drain region 42 are relatively smooth, and the contact performance that the source electrode 71 and the drain electrode 72 respectively contact with the polysilicon layer of the source region 41 and the drain region 42 can be improved.

The manufacturing method of the TFT substrate of this embodiment is performed by etching the barrier layers at different thicknesses. By using the thickness difference of the barrier layer, ions implanted at the source and drain regions of the polysilicon can pass through the barrier layer on the source and drain regions and are implanted into the corresponding polysilicon layer, moreover, the thickness of the barrier layer on the channel region is large, thus ions are blocked from being implanted into the polysilicon layer of the channel region, and then the ion implantation to the polysilicon layer of the source and drain regions without exposing the polysilicon layer can be achieved, thereby the damage of the polysilicon layer during the etching process can be avoided, and then the display quality is not affected.

Figure 3A:
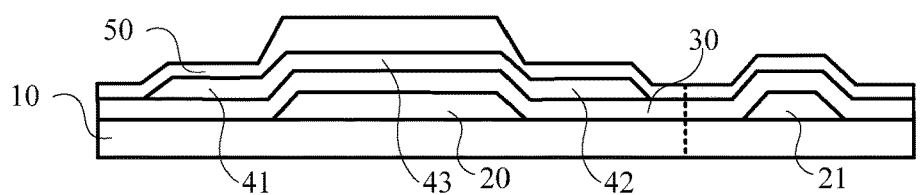
FIGS. 3a to 3c are schematic cross-sectional views of another application example of the TFT substrate in the each steps shown in FIG. 1.

Furthermore, as shown in FIG. 3a, in step S101, when a gate electrode 20, a gate insulating layer 30, a polysilicon layer, and a barrier layer are formed on the substrate 10, a metal wire 21 in the same layer as the gate electrode 20 is formed on the remaining region of the substrate 10 according to the actual requirements, the gate insulating layer 30 and the barrier layer 50 are formed over the metal wire 21 in the same layer as the gate electrode 20; it is noted that the metal wire 21 in the same layer as the gate electrode 20 is not necessarily connected to the gate electrode 20, and the connection relationship between the two needs to be set according to the actual requirements; wherein the metal wire 20 in the same layer as the gate electrode layer 21 and the gate electrode 20 are formed simultaneously, that is, when the conductive layer for forming the gate electrode 20 is patterned, part of the conductive layer is formed as the gate electrode 20, and the other part of the conductive layer is formed as the metal wire 21 in the same layer as the gate electrode 20.

Figure 3B:
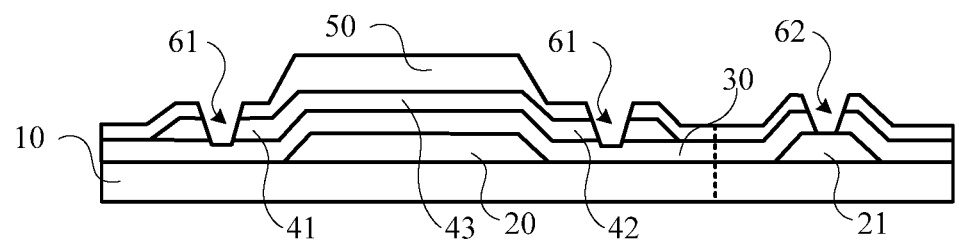

In some display panel applications, the metal wire 21 in the same layer as the gate electrode 20 is connected to the metal wire 73 in the same layer as the source electrode 71 and the drain electrode 72 to achieve signal conducting; therefore, as shown in FIG. 3b, in step S104, when fabricating the first contact holes 61 by using the second photomask, the barrier layer disposed outside the polysilicon layer may be patterned through the same photomask to form the second contact hole 62 on the barrier layer 50 disposed outside the polysilicon layer; it is noted that the barrier layer 50 disposed outside the polysilicon layer in this embodiment refers to the barrier layer 50 located above the metal wire 21 in the same layer as the gate electrode 20. The gate insulating layer 30 and the barrier layer 50 above the metal wires 21 in the same layer as the gate electrode 20 are etched by the second photomask to form the second contact hole 62, and the second contact hole 62 exposes the metal wire 21 at the same layer of the gate electrode 20.

It is to be noted that since the first contact holes 61 and the second contact hole 62 are simultaneously fabricated by the second photomask, if the transmittance of the second photomask corresponding to the first contact holes 61 is the same as that corresponding to the second contact hole 62, then the depth of the first contact holes 61 is the same as that of the second contact hole 62; the first contact holes 61 pass through the barrier layer 50 and the polysilicon layer of the source region 41 and the drain regions 42, and the second contact hole 62 passes through the barrier 50 and the gate insulating layer 30 above the metal wire 21 in the same layer as the gate electrode 20; since the thickness of the barrier layer 50 above the metal wire 21 in the same layer as the gate electrode 20 is the same as that of the barrier layer 50 on the etched source electrode 41 and the drain electrode 42, the thickness of the polysilicon layer is required to less than or equal to the thickness of the gate insulating layer, so as to form the first contact holes 61 and the second contact hole 62 simultaneously.

In this embodiment, in order to satisfy the relationship in thickness between the various layers, the thickness of the gate insulating layer 30 is set to 900 Å, the thickness of the polycrystalline silicon layer is set to 450 Å, since the thickness of the barrier layer 50 on the etched source region 41 and drain region 42 is 500 Å, the barrier layer 50 of 500 Å, the polysilicon layer of 450 Å, and the gate insulating layer 30 of 450 Å are etched away when forming the first contact holes 61, and the barrier layer of 500 Å, the gate insulating layer 30 of 900 Å are etched away when forming the second contact hole 62. When the second contact hole 62 exposes the metal wire 21 in the same layer as the gate electrode 20 by the thickness setting, the first contact holes 61 are formed through the polysilicon layer. It is noted that the thickness setting are only a specific thickness setting in an embodiment, in other embodiments, the thickness of each layer can be adjusted according to the requirements, only needs to satisfy the condition that when the second contact hole 62 exposes the metal wire in the same layer as the gate electrode 20, the first contact holes 61 passes through the polysilicon layer, wherein while the second contact holes 62 are fabricated, the metal wires 21 in the same layer as the gate electrode 20 is not etched.

Figure 3C:
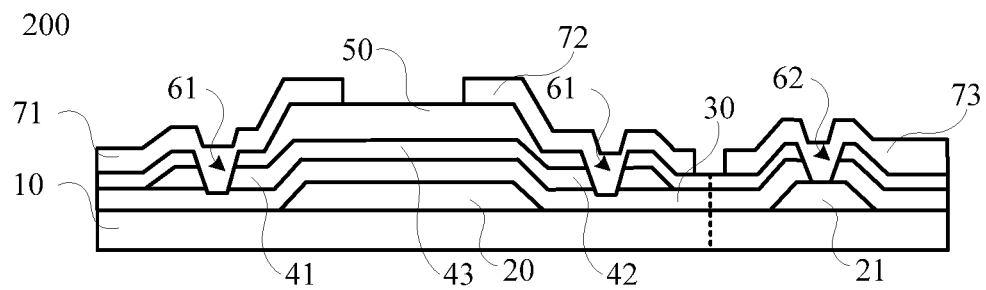

As shown in FIG. 3c, when the source electrode 71 and the drain electrode 72 are fabricated in step S105, a metal wire 73 in the same layer as the source electrode 71 and the drain electrode 72 is formed above the metal wire 21 in the same layer as the gate electrode 20, wherein the metal wire 73 in the same layer as the source electrode 71 and the drain electrode 72 is connected to the metal wire 21 in the same layer as the gate electrode 20 through the second contact hole 62. The metal wire 73 in the same layer as the source electrode 71 and drain electrode 72 is not connected to the source electrode 71 and the drain electrode 72.

This disclosure also discloses an embodiment of a TFT substrate, the TFT substrate of this embodiment was fabricated by the manufacturing method of the TFT substrate shown in FIG. 1, the structure of the obtained TFT substrate is the same as the TFT substrates 100 and 200 as shown FIGS. 2e and 3c, and will not be described here.

Figure 4:
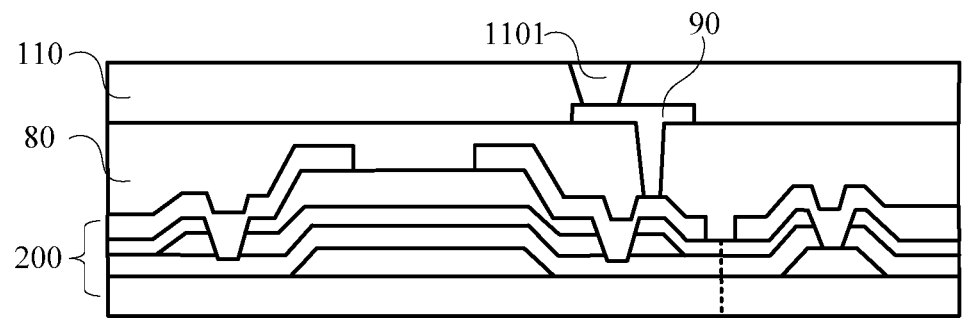
FIG. 4 is a schematic structural diagram of an embodiment of an OLED display panel of this disclosure.

Referring to FIG. 4, FIG. 4 is a schematic structural view of an embodiment of the OLED display panel of this disclosure. As shown in FIG. 4, the OLED display panel of this embodiment includes a TFT substrate 200 shown in FIG. 3c, and further includes a planarization layer, an anode layer, and an organic light emitting device layer above the TFT substrate 200. In other embodiments, the TFT substrate in the OLED display panel may also be the TFT substrate 100 shown in FIG. 2e.

In this embodiment, the planarization layer 80 is deposited on the TFT substrate 200, and another conductive layer is deposited on the planarization layer 80; the conductive layer is patterned to form an anode layer 90, and the anode layer 90 is an anode of an organic light emitting device (OLED Device). An organic light emitting device layer 110 is formed on the anode layer 90. The organic light emitting device layer 110 is provided with a plurality of organic light emitting devices 1101, and in this embodiment, the organic light emitting device 1101 is an OLED device, and the planarization layer 80 is an organic planarization layer.

Above are only embodiments of this disclosure is not patented and therefore limit the scope of this disclosure, the use of any content of the present specification and drawings made equivalent or equivalent structural transformation process, either directly or indirectly related to the use of other technologies areas are included in the same way the scope of the patent protection of this disclosure.

What is claimed is:

1. A manufacturing method of a TFT substrate, comprising:
    sequentially forming a gate electrode, a gate insulating layer, a polysilicon layer, and a barrier layer on a substrate, wherein the polysilicon layer comprises a source region, a drain region, and a channel region;
    etching the barrier layer located on the source and drain regions through a first photomask so that thickness of the barrier layer on the source and drain regions is that ions can pass through and is not zero;
    performing ion implantation to the polysilicon layer of the source and drain regions;
    patterning the barrier layer on the source and drain regions through a second photomask to form first contact holes on the barrier layer on the source and drain regions respectively;
    forming a source electrode and a drain electrode on the barrier layer, wherein the source and drain electrodes are connected to the polysilicon layer of the source and drain regions by passing through the first contact holes.

2. The manufacturing method according to claim 1, wherein etching of the barrier layer located on the source and drain regions through the first photomask comprises:
    making thickness of the barrier layer on the channel region after etching to be larger than that of the barrier layer on the source and drain regions through the first photomask, and making thickness of the barrier layer on the channel region after etching to be that ions cannot pass through.

3. The manufacturing method according to claim 2, wherein ion implantation to the polysilicon layer of the source and drain regions comprising:
    performing an ion implantation to the TFT substrate, ions located above the source and drain regions pass through the barrier layer on the source and drain regions and dope into the polysilicon layer of the source and drain regions, and ions located above the channel region are blocked by the barrier layer on the channel region.

4. The manufacturing method according to claim 1, wherein patterning of the barrier layer on the source and drain regions through the second photomask to form first contact holes on the barrier layer on the source and drain regions respectively, comprising:

patterning the barrier layer on the source and drain regions and the ion-implanted polysilicon layer through the second photomask to form the first contact holes in the patterned area of the barrier layer and the polysilicon layer.

5. The manufacturing method according to claim 1, wherein patterning of the barrier layer on the source and drain regions through the second photomask to form the first contact holes on the barrier layer on the source and drain regions respectively, further comprising:

patterning the barrier layer disposed outside the polysilicon layer through the second photomask to form a second contact hole on the barrier layer disposed outside the polysilicon layer;

wherein the second contact hole is used to connect the metal wire in the same layer as the gate electrode to the metal wire in the same layer as the source and drain electrodes, and the metal wire in the same layer as the gate electrode is located below the barrier layer disposed outside the polysilicon layer.

6. The manufacturing method according to claim 1, wherein thickness of the polysilicon layer is less than or equal to that of the gate insulating layer.

7. The manufacturing method according to claim 1, wherein thickness of the barrier layer on the source and drain regions is between 450 Å and 550 Å, and thickness of the barrier layer on the channel region after etching through the first photomask is the same as that before etching.

8. The manufacturing method according to claim 1, wherein bottom of the first contact holes expose the gate insulating layer.

* * * * *